US011459982B2

(12) United States Patent  
McClelland et al.

(10) Patent No.: US 11,459,982 B2  
(45) Date of Patent: *Oct. 4, 2022

(54) MASS AIRFLOW SENSOR AND HYDROCARBON TRAP COMBINATION

(71) Applicant: K&N Engineering, Inc., Riverside, CA (US)

(72) Inventors: Kevin McClelland, Rancho Cucamonga, CA (US); Steve Williams, Cherry Valley, CA (US)

(73) Assignee: K&N Engineering, Inc., Riverside, CA (US)

( * ) Notice: Subject to any disclaimer, the term of this patent is extended or adjusted under 35 U.S.C. 154(b) by 255 days.

This patent is subject to a terminal disclaimer.

(21) Appl. No.: 16/823,183

(22) Filed: Mar. 18, 2020

(65) Prior Publication Data

US 2020/0217283 A1    Jul. 9, 2020

Related U.S. Application Data

(63) Continuation of application No. 15/847,746, filed on Dec. 19, 2017, now Pat. No. 10,598,137.

(Continued)

(51) Int. Cl.
*B01D 53/04* (2006.01)
*F02M 25/08* (2006.01)
(Continued)

(52) U.S. Cl.
CPC ... *F02M 35/10281* (2013.01); *B01D 46/0036* (2013.01); *B01D 46/0049* (2013.01);
(Continued)

(58) Field of Classification Search
CPC ............ B01D 46/0035; B01D 46/0049; B01D 53/0446; B01D 2257/702;
(Continued)

(56) References Cited

U.S. PATENT DOCUMENTS

| | | |
|---|---|---|
| 4,375,204 A | 3/1983 | Yamamoto |
| 6,736,871 B1 | 5/2004 | Green et al. |

(Continued)

FOREIGN PATENT DOCUMENTS

DE           36 23 109           1/1987

*Primary Examiner* — Frank M Lawrence, Jr.
(74) *Attorney, Agent, or Firm* — Rutan & Tucker LLP; Hani Z. Sayed

(57) ABSTRACT

A combined mass airflow sensor and hydrocarbon trap is provided for absorbing evaporative hydrocarbon emissions from an air intake duct of an internal combustion engine. The combined mass airflow sensor and hydrocarbon trap comprises a duct that supports a hydrocarbon absorbing sheet in an unfolded configuration within a housing. The duct communicates an airstream from an air filter to the air intake duct during operation of the internal combustion engine. An opening in the housing receives a mass airflow sensor into the duct, such that the mass airflow sensor is disposed within the airstream. Guide vanes extending across the duct reduce air turbulence within the airstream passing by the mass airflow sensor. Ports disposed along the duct allow the evaporative hydrocarbon emissions to be drawn into the interior and arrested by the hydrocarbon absorbing sheet when the internal combustion engine is not operating.

8 Claims, 4 Drawing Sheets

Related U.S. Application Data

(60) Provisional application No. 62/436,989, filed on Dec. 20, 2016.

(51) Int. Cl.
*F02M 35/10* (2006.01)
*F02M 35/024* (2006.01)
*B01D 46/00* (2022.01)

(52) U.S. Cl.
CPC ....... *B01D 53/0446* (2013.01); *F02M 35/024* (2013.01); *F02M 35/10144* (2013.01); *F02M 35/10386* (2013.01); *B01D 2257/702* (2013.01); *B01D 2259/4516* (2013.01); *B01D 2259/4566* (2013.01); *B01D 2279/60* (2013.01)

(58) Field of Classification Search
CPC .... B01D 2259/4516; B01D 2259/4566; B01D 2279/60; F02M 35/0204; F02M 35/021; F02M 35/0216; F02M 35/024; F02M 35/0218; F02M 35/02483; F02M 35/046; F02M 35/10019; F02M 35/10144; F02M 35/10262; F02M 35/10281; F02M 35/10386; F02M 25/0854; Y02T 10/12

USPC .... 96/110, 134, 136, 139, 147, 154; 95/146, 95/23; 123/518, 198 E; 55/385.3
See application file for complete search history.

(56) References Cited

U.S. PATENT DOCUMENTS

| | | | |
|---|---|---|---|
| 7,976,619 B2 * | 7/2011 | Huff | B01D 46/0036 |
| | | | 96/134 |
| 2004/0255911 A1 | 12/2004 | Abdolhosseini et al. | |
| 2008/0000455 A1 * | 1/2008 | Treier | F02M 25/0854 |
| | | | 123/519 |
| 2008/0072979 A1 | 3/2008 | Rosenbaum et al. | |
| 2008/0127949 A1 | 6/2008 | Herald et al. | |
| 2010/0089368 A1 | 4/2010 | Hirata et al. | |
| 2010/0089372 A1 | 4/2010 | Bellis et al. | |
| 2012/0222641 A1 | 9/2012 | Mackenzie et al. | |
| 2012/0304629 A1 * | 12/2012 | Metzger | F02M 35/1266 |
| | | | 60/311 |
| 2017/0113172 A1 * | 4/2017 | Yoshida | B01D 53/0407 |
| 2020/0129912 A1 * | 4/2020 | Williams | B01D 53/02 |

* cited by examiner

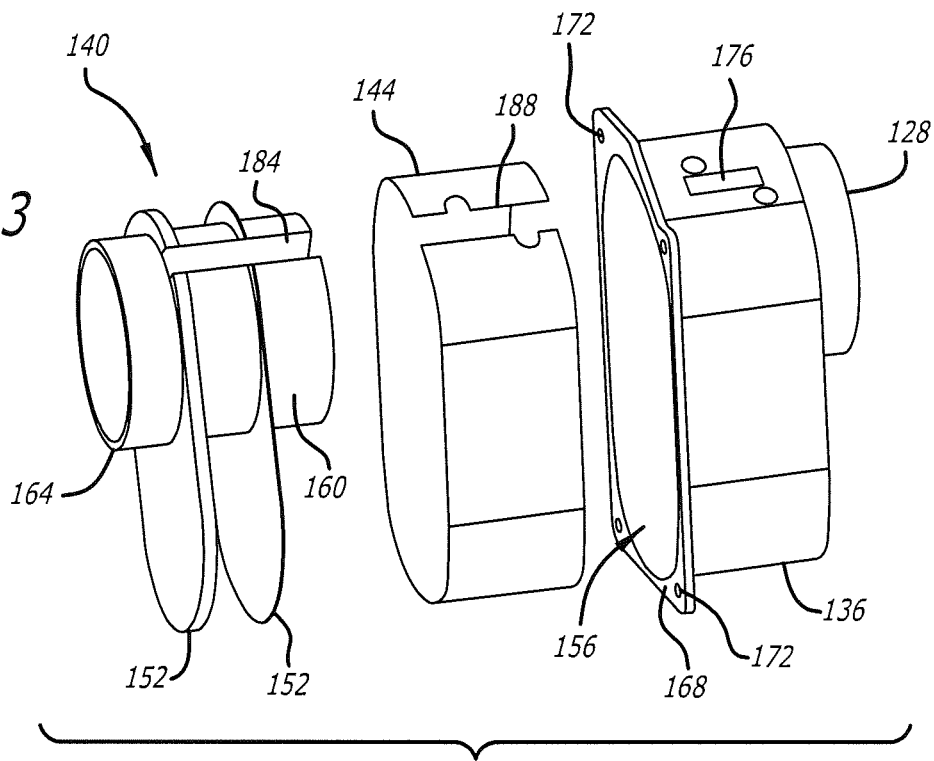
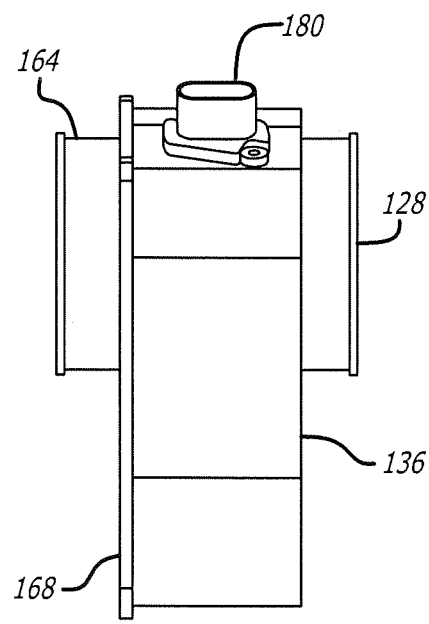

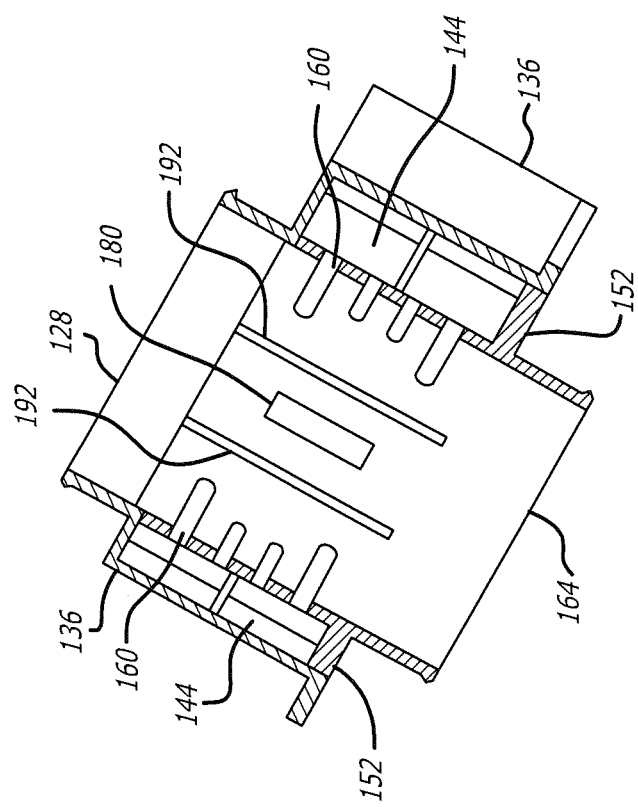
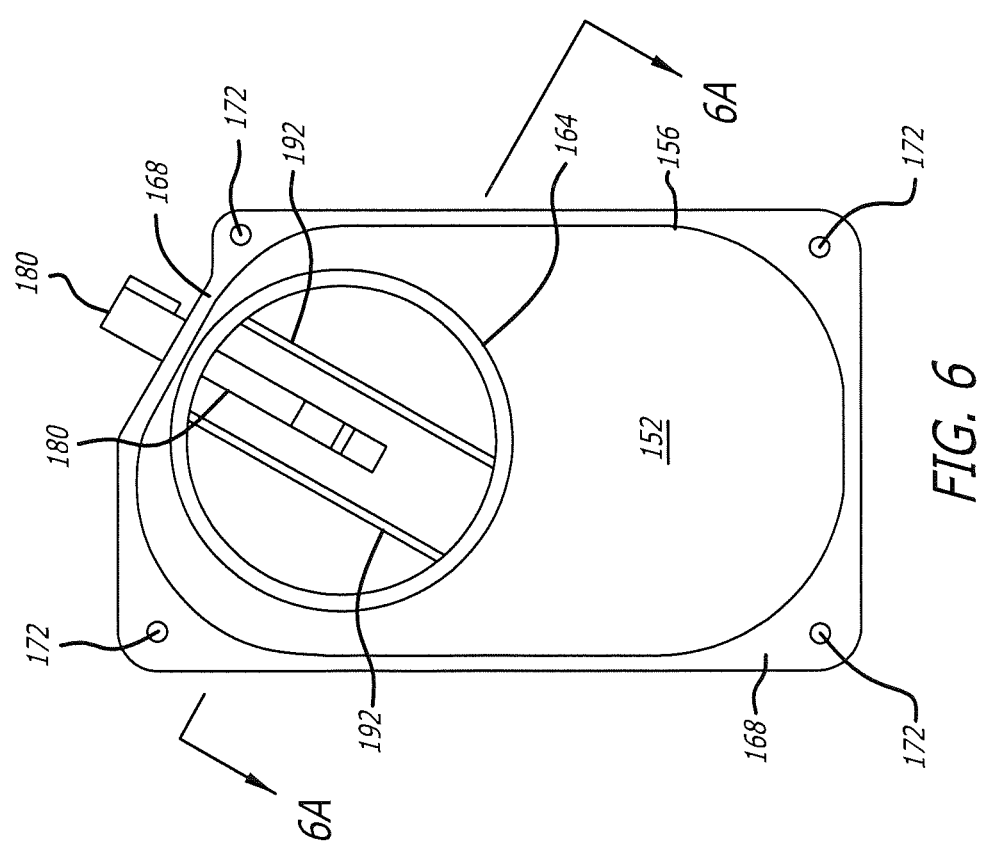
FIG. 6A
FIG. 6

MASS AIRFLOW SENSOR AND HYDROCARBON TRAP COMBINATION

PRIORITY

This application claims the benefit of and priority to U.S. patent application Ser. No. 15/847,746 filed on Dec. 19, 2017 and now issued as U.S. Pat. No. 10,598,137 date Mar. 24, 2020 and U.S. Provisional Application, entitled "Mass Airflow Sensor And Hydrocarbon Trap Combination," filed on Dec. 20, 2016 and having application Ser. No. 62/436,989.

FIELD

The field of the present disclosure generally relates to engine air intake systems. More particularly, the field of the invention relates to a combined mass airflow sensor and hydrocarbon trap that exhibits a low resistance to airflow and absorbs evaporative hydrocarbon emissions from an intake manifold of an internal combustion engine after engine shutdown.

BACKGROUND

An air intake filter removes particulate matter from air entering an air intake manifold of a motor vehicle. A variety of filter shapes have evolved over time for this purpose, such as flat panel, ring, cylindrical and frustoconical (section of a cone) designs. While air filters have largely served the purpose of removing particulate matter, such as dirt or debris, from the air entering the air intake manifold, such filters provide little help in preventing evaporative emissions from leaking out of the intake manifold and entering the atmosphere. Such emissions, arising chiefly when the engine is turned off and the intake manifold is hot, are a well-known contributor to air pollution.

During operation of an internal combustion engine, an airflow is drawn through the air intake system into an intake manifold and then finally into combustion chambers of the engine. The airflow is caused by the intake stroke of pistons within the engine, which forms an internal pressure within the intake manifold that is lower than the atmospheric pressure of the environment, and thus outside air is drawn into the air intake system. Evaporative emissions are prevented from exiting the air intake system due to the low internal pressure within the intake manifold and the airflow into the air intake system during operation of the internal combustion engine.

After engine shut-down, air continues to rush through the air intake system until the internal pressure within the intake manifold equals the atmospheric pressure of the environment. Evaporative hydrocarbons may be emitted if uncombusted fuel is present in the air intake system, such as due to pressurized fuel leaking from fuel rail(s) into the intake manifold through fuel injectors. This small amount of fuel may vaporize, and the resulting hydrocarbon vapor may migrate out of the air intake system into the atmosphere. Although such hydrocarbon vapor egress was once considered negligible, current regulations and environmental awareness have created a desire to eliminate evaporative emissions from the air intake systems of internal combustion engines.

Attempts to eliminate evaporative hydrocarbon emissions have included placing secondary, hydrocarbon adsorbing filters directly across the path of airflow into the air intake system. As will be appreciated, however, disposing extra layers of filtration media across the airflow path causes an additional flow restriction to be placed onto the air intake system. As such, the internal combustion engine is generally less efficient, or the air intake system may need to be increased in size so as to compensate for the increased flow restriction.

Other attempts to eliminate evaporative hydrocarbon emissions have included combining hydrocarbon vapor-adsorbing materials with conventional air filters. One drawback associated with these combination filters includes vapor-adsorbing materials flaking out of the combination filter and entering the air intake system. Further, such a loss of vapor-adsorbing materials may adversely affect the vapor absorbance of the combination filter. Accordingly, there is a need for eliminating hydrocarbon leakage from air intake systems of internal combustion engines without adversely affecting engine performance.

SUMMARY

A hydrocarbon trap is provided for absorbing evaporative hydrocarbon emissions from an air intake duct of an internal combustion engine. The hydrocarbon trap comprises a duct configured to communicate an airstream from an air filter to the air intake duct. A multiplicity of ports are disposed along the duct to allow evaporative hydrocarbon emissions to be drawn from the air intake duct. A housing is configured to support the duct and at least one hydrocarbon absorbing sheet to arrest the evaporative hydrocarbon emissions. The housing is configured to be coupled with an air box so as to communicate the airstream through the duct during operation of the internal combustion engine. The duct is coupled with at least one support configured to maintain the hydrocarbon absorbing sheet in an unfolded configuration adjacent to an inner perimeter surface of the housing. A port in the housing is configured to support a mass airflow sensor within the duct. At least one guide vane extends across an interior of the duct adjacent to the mass airflow sensor and is configured to reduce air turbulence within the airstream passing through the duct during operation of the internal combustion engine.

In an exemplary embodiment, a hydrocarbon trap for absorbing evaporative hydrocarbon emissions from an air intake duct of an internal combustion engine comprises: a duct configured to communicate an airstream from an air filter to the air intake duct; a multiplicity of ports disposed along the duct to allow evaporative hydrocarbon emissions to be drawn from the air intake duct; a housing configured to support the duct and at least one hydrocarbon absorbing sheet to arrest the evaporative hydrocarbon emissions; and a port in the housing configured to support a mass airflow sensor within the duct.

In another exemplary embodiment, the duct is coupled with at least one support configured to maintain the hydrocarbon absorbing sheet in an unfolded configuration adjacent to an inner perimeter surface of the housing. In another exemplary embodiment, the at least one support is configured with a shape that matches the shape of the interior and a size that provides clearance for the hydrocarbon absorbing sheet to be disposed between the edges of the at least one support and the inner perimeter surface.

In another exemplary embodiment, the housing is configured to be coupled with an air box so as to communicate the airstream through the duct during operation of the internal combustion engine. In another exemplary embodiment, the housing comprises a mounting surface that is configured to mate with a substantially similar surface disposed on the air box. In another exemplary embodiment, one or more holes disposed in the mounting surface are configured to receive fasteners for coupling the housing to the air box.

In another exemplary embodiment, the port is configured to extend the mass airflow sensor into the airstream within the duct during operation of the internal combustion engine. In another exemplary embodiment, the duct includes a channel that is configured to receive the mass airflow sensor when the duct is installed into the housing. In another exemplary embodiment, the hydrocarbon absorbing sheet includes a separation configured to receive the mass airflow sensor when the duct is installed into the housing.

In another exemplary embodiment, at least one guide vane extends across an interior of the duct adjacent to the mass airflow sensor and is configured to reduce air turbulence within the airstream passing through the duct during operation of the internal combustion engine. In another exemplary embodiment, the at least one guide vane comprises two guide vanes disposed on opposite sides of the mass airflow sensor and configured to encourage a substantially laminar flow of the airstream on both sides of the mass airflow sensor.

In an exemplary embodiment, a hydrocarbon trap for absorbing evaporative hydrocarbon emissions from an air intake duct of an internal combustion engine comprises: a housing coupled with an air filter; a duct disposed within the housing to communicate an airstream from the air filter to the air intake duct; a hydrocarbon absorbing sheet disposed between the duct and the housing; and a mass airflow sensor disposed within the airstream.

In another exemplary embodiment, the duct is comprised of at least one support configured to maintain the hydrocarbon absorbing sheet in an unfolded configuration adjacent to an inner perimeter surface of the housing. In another exemplary embodiment, a multiplicity of ports disposed along the duct are configured to allow the evaporative hydrocarbon emissions to be drawn from the air intake duct into the housing. In another exemplary embodiment, the housing comprises a port configured to extend the mass airflow sensor into the duct.

In another exemplary embodiment, at least two guide vanes extend across the duct adjacent to the mass airflow sensor and are configured to reduce air turbulence within the airstream passing by the mass airflow sensor during operation of the internal combustion engine. In another exemplary embodiment, the mass airflow sensor is disposed between the at least two guide vanes, such that the airstream is substantially laminar on both sides of the mass airflow sensor. In another exemplary embodiment, the housing is configured to be coupled with an air box that contains the air filter, such that the airstream is communicated from the air filter to the air intake duct.

In an exemplary embodiment, a hydrocarbon trap for absorbing evaporative hydrocarbon emissions from an air intake duct of an internal combustion engine comprises: a duct configured to communicate an airstream from an air filter to the air intake duct; a housing configured to support the duct and at least one hydrocarbon absorbing sheet within an interior of the housing; one or more supports coupled with the duct and configured to maintain the hydrocarbon absorbing sheet in an unfolded configuration within the housing; and a multiplicity of ports disposed along the duct and configured to allow the evaporative hydrocarbon emissions to be drawn from the duct and arrested by the hydrocarbon absorbing sheet.

In another exemplary embodiment, the housing is configured to be coupled with an air box that at least partially surrounds the air filter, such that the airstream is communicated into the duct during operation of the internal combustion engine. In another exemplary embodiment, the housing comprises a port configured to receive a mass airflow sensor into the duct, such that the mass airflow sensor is exposed to the airstream.

BRIEF DESCRIPTION OF THE DRAWINGS

The drawings refer to embodiments of the present disclosure in which:

FIG. 3 illustrates a second exploded view of the combined mass airflow sensor and hydrocarbon trap of FIG. 1;

FIG. 4 illustrates a side plan view of an exemplary embodiment of a combined mass airflow sensor and hydrocarbon trap;

FIG. 6 illustrates a rear plan view of the combined mass airflow sensor and hydrocarbon trap of FIG. 4; and FIG. 6A illustrates a cross-sectional view of the combined mass airflow sensor and hydrocarbon trap of FIG. 6, taken along a line B-B.

Figure 1:
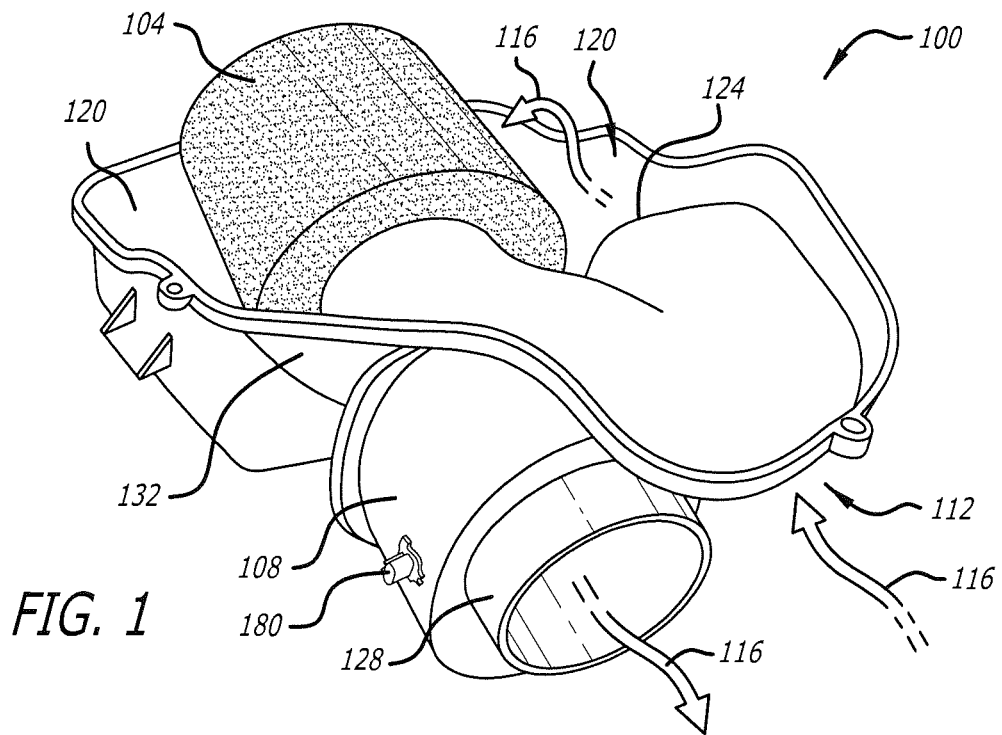
FIG. 1 illustrates an exemplary embodiment of an air box containing an air filter coupled with a combined mass airflow sensor and hydrocarbon trap in accordance with the present disclosure.

While the present disclosure is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the present disclosure.

DETAILED DESCRIPTION

In the following description, numerous specific details are set forth in order to provide a thorough understanding of the present disclosure. It will be apparent, however, to one of ordinary skill in the art that the invention disclosed herein may be practiced without these specific details. In other instances, specific numeric references such as "first filter medium," may be made. However, the specific numeric reference should not be interpreted as a literal sequential order but rather interpreted that the "first filter medium" is different than a "second filter medium." Thus, the specific details set forth are merely exemplary. The specific details may be varied from and still be contemplated to be within the spirit and scope of the present disclosure. The term "coupled" is defined as meaning connected either directly to the component or indirectly to the component through another component. Further, as used herein, the terms "about," "approximately," or "substantially" for any numerical values or ranges indicate a suitable dimensional tolerance that allows the part or collection of components to function for its intended purpose as described herein.

In general, the present disclosure describes a combined mass airflow sensor and hydrocarbon trap for absorbing evaporative hydrocarbon emissions from an air intake duct of an internal combustion engine. The combined mass airflow sensor and hydrocarbon trap comprises a housing that is configured to support a duct and at least one hydrocarbon absorbing sheet within an interior of the housing. The duct is configured to communicate an airstream from an air filter to the air intake duct during operation of the internal combustion engine. A mounting surface of the housing may be configured to mate with, and be fastened to, a substantially similar surface disposed on an air box that contains the air filter. The housing comprises a port that is configured to receive a mass airflow sensor into the duct, such that the mass airflow sensor is disposed within the airstream. A pair of guide vanes extend across the duct and are configured to reduce air turbulence within the airstream passing adjacent to the mass airflow sensor through the duct. At least one support comprising the duct is configured to maintain the hydrocarbon absorbing sheet in an unfolded configuration adjacent to an inner perimeter surface of the housing. The shape of the support matches the shape of the interior, and the support has a size that provides clearance for the hydrocarbon absorbing sheet to be disposed between the edges of the support and the inner perimeter surface. A multiplicity of ports disposed along the duct are configured to allow the evaporative hydrocarbon emissions to be drawn into the interior and arrested by the hydrocarbon absorbing sheet when the internal combustion engine is not operating.

FIG. 1 illustrates an upper perspective view of an exemplary embodiment of a lower portion of an air box 100 that contains an air filter 104 coupled with a combined mass airflow sensor and hydrocarbon trap 108 (hereinafter, "hydrocarbon trap") in accordance with the present disclosure. The air box 100 is comprised of at least one air inlet 112 that communicates an airstream 116 into an interior 120 of the air box by way of a duct 124. The air filter 104 is disposed within the interior 120 and configured to remove particulate matter and contaminants that may be flowing with the airstream 116 before the airstream passes through the hydrocarbon trap 108 and then is directed through a conduit 128 to an air intake duct of the internal combustion engine. The hydrocarbon trap 108 is configured to absorb evaporative hydrocarbon emissions leaking from the air intake duct when the internal combustion engine is not operating.

The air box 100 generally is comprised of a housing 132 that is configured to improve movement of the airstream 116 through the air filter 104. The housing 132 is configured to support the air filter 104 and provide an interface between an interior of the air filter and the air intake duct of the engine. It is contemplated that various techniques may be employed to couple the air filter 104 with the interior 120 of the housing 132, without limitation. For example, the housing 132 may include a mount portion that facilitates coupling the air filter 104 with an interior surface of the housing, thereby establishing an air-leak resistant connection between the interior of the air filter 104 and the air intake duct of the engine. The housing 132 preferably is comprised of a material that is sufficiently durable and temperature resistant to retain its configuration during operation when coupled with the air intake duct of the engine. It is envisioned that the housing 132 may be formed by way of injection molding, or other similar techniques.

Figure 2:
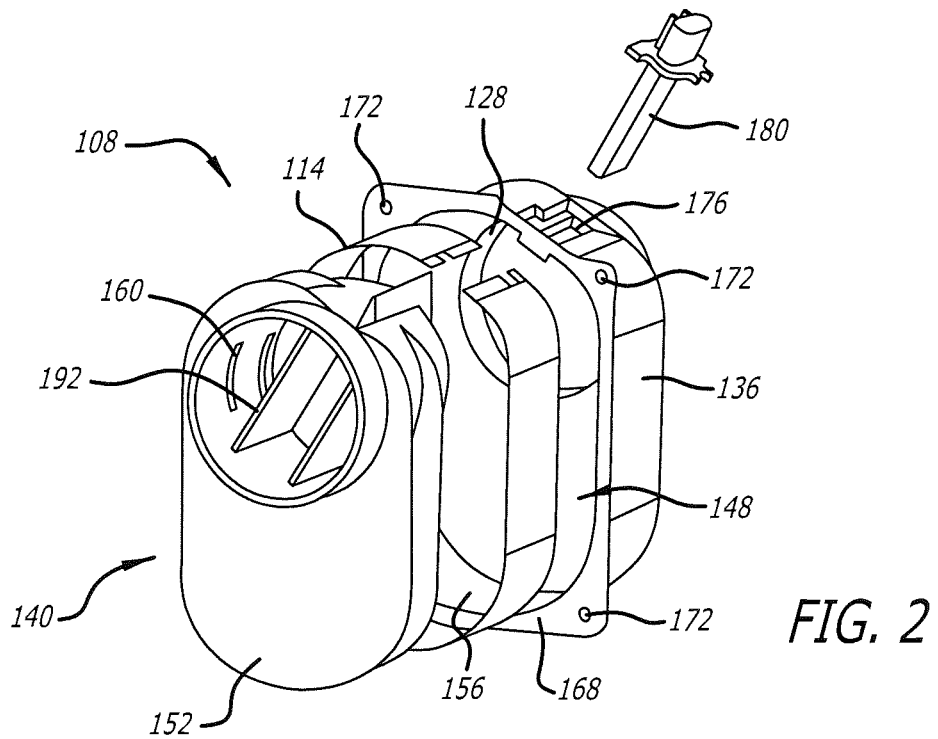
FIG. 2 illustrates a first exploded view of an exemplary embodiment of a combined mass airflow sensor and hydrocarbon trap.
Figure 5A:
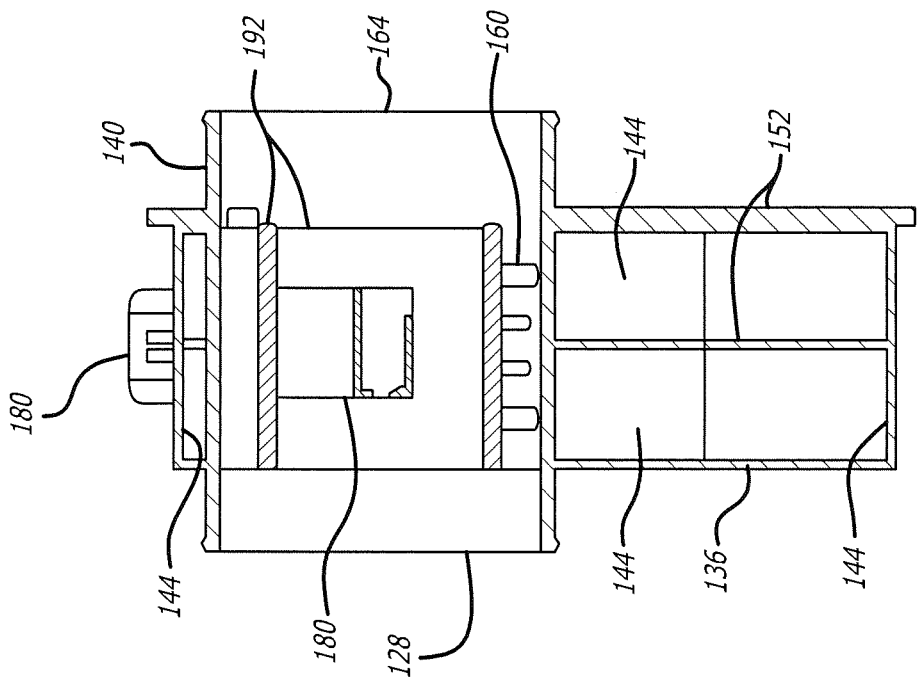
FIG. 5A illustrates a cross-sectional view of the combined mass airflow sensor and hydrocarbon trap of FIG. 5, taken along a line A-A.

FIGS. 2-3 illustrate exploded views of an exemplary embodiment of the hydrocarbon trap 108 that may be coupled with the air box 100 according to the present disclosure. The hydrocarbon trap 108 is comprised of a housing 136 that supports a duct 140 and at least one hydrocarbon absorbing sheet 144 within an interior 148 of the housing. The duct 140 is comprised of two or more supports 152 that are configured to maintain the hydrocarbon absorbing sheet 144 disposed in a smooth, unfolded configuration adjacent to an inner perimeter surface 156 of the housing 136. The supports 152 generally have a shape that matches the shape of the interior 148, and have a size that provides enough clearance for the hydrocarbon absorbing sheet 144 to be disposed between the edges of the supports 152 and the inner perimeter surface 156, as shown in FIG. 5A. The supports 152 may be fabricated as extended portions of the duct 140 in the form of an individual component, or may be comprised of separate components that may be coupled with the duct 140.

A multiplicity of ports 160 disposed along the duct 140 are configured to allow evaporative hydrocarbon emissions to be drawn to, and arrested by the hydrocarbon absorbing sheet 144 when the engine is not operating. As best shown in FIGS. 3 and 6A, the ports 160 may be comprised of narrow openings within the duct 140 that allow evaporative hydrocarbon emissions to migrate into the interior 148, between the supports 152. It should be understood, however, that the ports 160 are not to be limited to narrow openings, but rather the ports 160 may be comprised of shaped openings other than the narrow openings illustrating in FIGS. 3 and 6A. Further, it is envisioned that, in some embodiments, any of various shaped portions, ridges, channels, ducts, and any other surface features, may be incorporated into the duct 140 and coupled with the ports 160, as is deemed beneficial to the evaporation of hydrocarbon emissions, without limitation.

The duct 140 is configured to direct the airstream 116 through the hydrocarbon trap 108 while the engine is operating. As such, the duct 140 comprises a flange 164 that is configured to be coupled with the air filter 104. The flange 164 may be directly received into a base of the air filter 104, or may be coupled with a tube, duct, or adapter comprising a portion of the air box 100 that receives the air filter 104. Further, the housing 136 comprises a mounting surface 168 and multiple holes 172 that are configured to enable fastening the hydrocarbon trap 108 onto the air box 100 so as to place the flange 164 into fluid communication with the interior of the air filter 104, as described herein. It is contemplated that the mounting surface 168 may be configured to mate with a substantially similar surface disposed on the air box 100. A suitable gasket may be positioned between the mounting surface 168 and the surface on the air box 100 so as to provide an air-leak resistant joint between the air filter 104 and the air intake duct of the engine.

Figure 5:
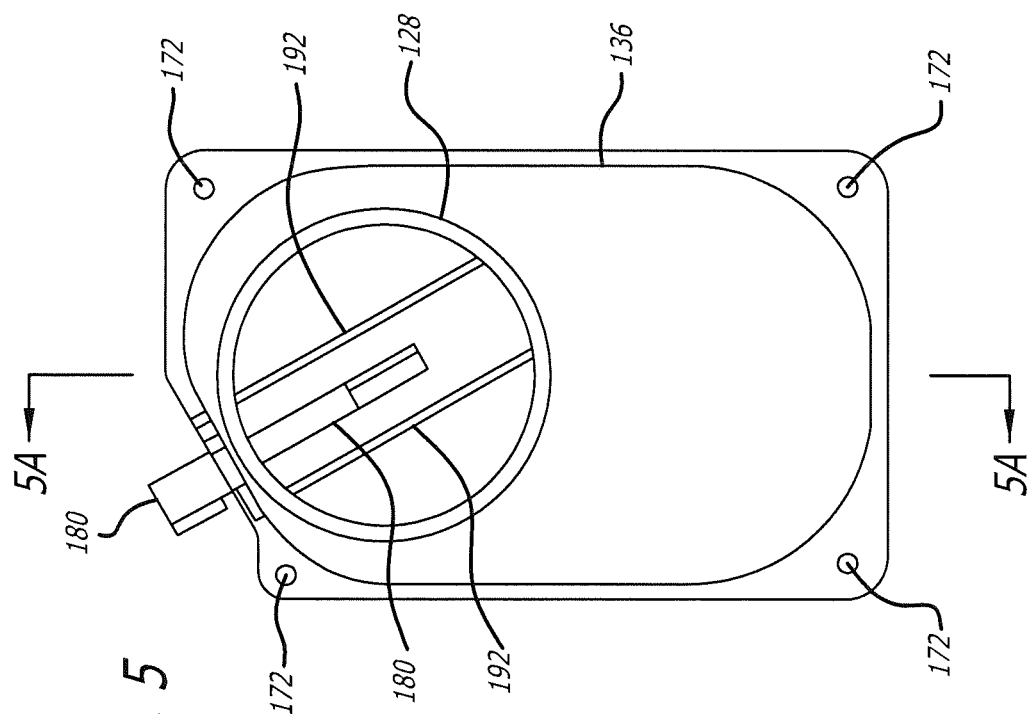
FIG. 5 illustrates a front plan view of the combined mass airflow sensor and hydrocarbon trap of FIG. 4.

As best shown in FIG. 3, the housing 136 comprises an opening or port 176 that is configured to receive a mass airflow sensor 180 into the hydrocarbon trap 108 such that the mass airflow sensor 180 may be placed into contact with the airstream 116, as best shown in FIGS. 4, 5, and 6. A channel 184 disposed within the duct 140 and a separation 188 comprising the hydrocarbon absorbing sheet 144 are configured to accommodate the mass airflow sensor 180 extending into the interior 148 during installation of the duct 140 and the hydrocarbon absorbing sheet 144 into the housing 136. For example, the channel 184 and separation 188 may facilitate inserting the duct 140 and hydrocarbon absorbing sheet 144 into the housing 136 after the mass airflow sensor 180 has been inserted into the port 176 and fastened onto the housing 136. It is contemplated that the channel 184 and separation 188 may facilitate periodically removing and replacing the hydrocarbon absorbing sheet 144 without necessitating removal of the mass airflow sensor 180 from the housing 136. In some embodiments, however, any of various suitably sized openings may be disposed in the duct 140 and hydrocarbon absorbing sheet 144, in lieu of the channel 184 and separation 188, and configured to receive the mass airflow sensor 180.

As best shown in FIGS. 5 and 6, the duct 140 comprises at least a pair of guide vanes 192 that extend across an interior of the duct and adjacent to the mass airflow sensor 180. The guide vanes 192 are configured to advantageously reduce air turbulence within the airstream 116 passing by the mass airflow sensor 180 during operation of the engine. It is contemplated that reducing turbulence of the airstream 116 passing by the mass airflow sensor 180 may provide relatively greater accuracy of air flow measurements. As shown in FIGS. 6 and 6A, the mass airflow sensor 180 may be disposed between the guide vanes 192 so as to encourage a substantially laminar flow of the airstream 116 on both sides of the mass airflow sensor. In some embodiments, the guide vanes 192 may be molded as a portion of the duct 140, or the guide vanes 192 may comprise separate components that may be coupled with the duct 140, without limitation. It is contemplated that any of various structures may be implemented, in lieu of the guide vanes 192, as may be found to advantageously reduce turbulence in the airstream 116, without limitation.

While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. To the extent there are variations of the invention, which are within the spirit of the disclosure or equivalent to the inventions found in the claims, it is the intent that this patent will cover those variations as well. Therefore, the present disclosure is to be understood as not limited by the specific embodiments described herein, but only by scope of the appended claims.

What is claimed is:

1. A method for trapping evaporative hydrocarbon emissions from an internal combustion engine, comprising:
   configuring a duct to conduct an airstream from an air filter into an air intake of an engine;
   forming one or more ports in the duct to allow hydrocarbon emissions to exit the air intake;
   surrounding the duct with a housing for receiving the hydrocarbon emissions;
   erecting a hydrocarbon absorbing sheet inside the housing to capture the hydrocarbon emissions; and
   configuring a port for supporting a mass airflow sensor within the duct.

2. The method of claim 1, wherein surrounding the duct includes configuring the housing to be coupled with an air box that houses the air filter.

3. The method of claim 2, wherein configuring the housing includes adapting a mounting surface to mate with a mounting surface comprising the air box.

4. The method of claim 3, wherein configuring the housing includes adapting the housing to be fastened onto the air box such that the duct conducts the airstream from the air filter to the air intake.

5. The method of claim 3, wherein configuring the housing further includes maintaining the hydrocarbon absorbing sheeting in an unfolded configuration.

6. The method of claim 5, wherein configuring the housing further includes forming one or more supports inside the housing to extend the hydrocarbon absorbing sheet along an inner perimeter surface of the housing.

7. The method of claim 1, wherein configuring the port for supporting the mass airflow sensor includes extending one or more guide vanes across the duct to encourage a substantially laminar flow of the airstream near the mass airflow sensor.

8. The method of claim 1, wherein forming the one or more ports includes adapting the one or more ports to allow the hydrocarbon emissions to be drawn to the hydrocarbon absorbing sheet when the internal combustion engine is not operating.

* * * * *